United States Patent
Kim et al.

(10) Patent No.: US 6,245,632 B1
(45) Date of Patent: Jun. 12, 2001

(54) VARIABLE TEMPERATURE METHODS OF FORMING HEMISPHERICAL GRAINED SILICON (HSG-SI) LAYERS

(75) Inventors: Young-sun Kim, Kyungki-do; Se-jin Shim, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/013,504

(22) Filed: Jan. 26, 1998

Related U.S. Application Data

(63) Continuation-in-part of application No. 08/861,607, filed on May 22, 1997, now Pat. No. 5,960,281.

(51) Int. Cl.⁷ .................................................. H01L 21/20
(52) U.S. Cl. ........................................ 438/398; 438/255
(58) Field of Search .................................. 438/398, 255, 438/964, 238; 437/52; 257/309, 298

(56) References Cited

U.S. PATENT DOCUMENTS

| | | | |
|---|---|---|---|
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | * 1/1995 | Tatsumi et al. | 438/109 |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiyama | 437/60 |
| 5,500,388 | 3/1996 | Niino et al. | 437/89 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | * 4/1997 | Watanabe et al. | 257/309 |
| 5,858,852 | * 1/1999 | Aiso et al. | 438/396 |
| 5,872,033 | * 7/1998 | Omid-Zohoor | 438/398 |
| 5,897,352 | * 4/1999 | Lin et al. | 438/255 |
| 5,932,333 | * 8/1999 | Lee | 438/255 |
| 5,960,281 | * 9/1999 | Nam et al. | 438/255 |

FOREIGN PATENT DOCUMENTS

| | | | |
|---|---|---|---|
| 0731491A2 | 9/1996 | (EP) | H01L/21/20 |
| 4-286151 | 10/1992 | (JP) | |
| 93-20677 | 10/1993 | (KR) | |

OTHER PUBLICATIONS

H. Watanabe et al., An Advanced Fabrication Technology of Hemispherical Grained (HSG) Poly–Si for High Capacitance Storage Electrodes, Extended Abstracts of the 1991 International Conference on Solid State Devices and Materials, Yokohama, Aug. 27–19, 1991, pp. 478–480.

H. Watanabe et al., Hemispherical Grained Silicon (HSG–Si) Formation on In–Situ Phosphorous Doped Amorphous–Si Using The Seeding Method, Extended Abstracts of the 1992 International Conference on Solid State Devices and Materials, Tsukuba, Aug. 26–28, 1992, pp. 422–424.

H. Watanabe et al., A New Cylindrical Capacitor Using Hemispherical Grained Si (HSG–Si) for 256Mb DRAMs, 1992 IEEE, IEDM, 10.1.1–10.1.4, pp. 259–262.

Notice to Submit Response, Korean Patent Application No. 10–1996–0031220 (Dec. 9, 1999).

Translation, Notice to Submit Response, Korean Patent Application No. 10–1996–0031220 (Dec. 9, 1999).

* cited by examiner

*Primary Examiner*—Matthew Smith
*Assistant Examiner*—Calvin Lee
(74) *Attorney, Agent, or Firm*—Myers Bigel Sibley & Sajovec

(57) ABSTRACT

A method of forming a hemispherical grained silicon layer includes the steps of providing a microelectronic substrate including a conductive layer thereon, and heating the conductive layer to a first predetermined temperature. Hemispherical grained silicon seeds are formed on the conductive layer while maintaining the conductive layer and the substrate at a second predetermined temperature higher than the first predetermined temperature. The hemispherical grained silicon seeds are annealed at a third predetermined temperature which is lower than the second predetermined temperature thereby growing the seeds to form a hemispherical grained silicon layer on the conductive layer.

19 Claims, 2 Drawing Sheets

VARIABLE TEMPERATURE METHODS OF FORMING HEMISPHERICAL GRAINED SILICON (HSG-SI) LAYERS

RELATED APPLICATIONS

The present application is a continuation-in-part of U.S. patent application Ser. No. 08/861,607, filed May 22, 1997, issued Sep. 28, 1999, as U.S. Pat. No. 5,960,281.

FIELD OF THE INVENTION

The present invention relates to the field of microelectronics and more particularly to methods of forming hemispherical grained silicon layers.

BACKGROUND OF THE INVENTION

As integrated circuit memory devices become more highly integrated, the area of the substrate available for each memory cell is reduced. Accordingly, each memory cell capacitor and memory cell transistor must be fabricated on a smaller area of the substrate. By reducing the area available for the memory cell capacitor, however, it may be difficult to maintain a desired capacitance.

The capacitance C of a capacitor is proportional to the surface area A of the capacitor storage electrode and to the dielectric constant $\epsilon$ of the dielectric between the capacitor electrodes. The capacitance is inversely proportional to the distance d between the storage electrodes which is also the thickness of the dielectric layer. These relationships are mathematically shown in the following equation:

$$C = \epsilon(A/d).$$

Accordingly, memory devices having increased integration densities may have reduced memory cell capacitances.

A memory cell capacitor is used to store a bit of data in a dynamic random access memory device. In particular, the presence of a first predetermined electrical charge indicates a data value of "1", and the presence of a second predetermined electrical charge indicates a data value of "0". Accordingly, the capacitor should be capable of maintaining the predetermined charges without significant variations. In particular, charge variations (causing soft errors) due to external influences such as alpha-particles should be reduced. There is thus a need to maintain a predetermined capacitance for memory cell capacitors despite the reduced substrate areas available for each memory cell capacitor.

Methods for increasing the surface area of a capacitor electrode on a predetermined area of a substrate have thus been explored. In particular, capacitor storage electrodes have been developed having three-dimensional structures such as stack-type electrodes, cylindrical type electrodes, and fin type electrodes. The manufacturing steps used to produce these three-dimensional structures, however, may be undesirably complex.

Alternately, hemispherical grained silicon (HSG-Si) layers have been used to provide capacitor storage electrodes having increased surface areas. These structures can be formed with less complexity than may be required to form the above mentioned three-dimensional structures. A method for forming a hemispherical grained silicon layer will now be discussed with reference to FIG. 1. FIG. 1 is a graph illustrating the process temperatures for steps of a conventional method of forming a hemispherical grained silicon layer. As shown, this method includes three steps: a standby step 10; a seeding step 12; and an annealing step 14. The standby step 10 is used to prepare a wafer used in the formation of the hemispherical grained silicon layer wherein the wafer is heated prior to forming the hemispherical grained silicon layer on the wafer. Before heating the wafer, a capacitor storage electrode is formed on the wafer.

During the seeding step 12, HSG seeds are implanted on the capacitor storage electrode, and these HSG seeds provide nuclei for the formation of the hemispherical grained silicon layer. The seeding step 12 is performed at a temperature $t_2$ which is the same temperature used during the standby step 10. During the annealing step 14, silicon is grown from the seeds implanted on the wafer to form the hemispherical grained silicon layer. This annealing step is performed at a temperature $t_1$ which is lower than the temperature $t_2$ used during the standby step 10 and the seeding step 12.

As discussed above, the standby step 10 and the seeding step 12 are performed at the same temperature when forming a hemispherical grained silicon layer according to the prior art. The capacitor storage electrode may thus be overheated during the standby step 10 thereby resulting in crystallization of the storage electrode. As a result, the quality of the HSG seeds formed during the seeding step 12 may be reduced. Accordingly, it may be difficult to form a stable hemispherical grained silicon layer during the annealing step 14.

SUMMARY OF THE INVENTION

It is therefore an object of the present invention to provide improved methods of forming hemispherical grained silicon layers.

It is another object of the present invention to provide capacitor storage electrodes having increased surface areas.

These and other objects are provided according to the present invention by methods including the steps of providing a microelectronic substrate, including a conductive layer thereon, and heating the conductive layer to a first predetermined temperature. Hemispherical grained silicon seeds are formed on the conductive layer while maintaining the conductive layer and the substrate at a second predetermined temperature higher than the first predetermined temperature. The hemispherical grained silicon seeds are annealed at a third predetermined temperature lower than the second predetermined temperature thereby growing the seeds to form a hemispherical grained silicon layer on the conductive layer. By heating the conductive layer to the first predetermined temperature lower than the second predetermined temperature, undesired crystallization of the conductive layer can be reduced, thereby increasing the uniformity of the hemispherical grained silicon layer formed thereon. Accordingly, the surface area of the hemispherical grained silicon layer can be increased.

The first and third temperatures can be approximately the same. Alternately, the first and third temperatures can be different as long as both are less than the second temperature. Moreover, the step of forming the hemispherical grained silicon seeds can include exposing the conductive layer to a silicon source gas such as silane or disilane.

The conductive layer can be an amorphous silicon layer. In addition, the step of heating the conductive layer can be preceded by the step of patterning the conductive layer so that portions of the substrate are exposed adjacent the patterned conductive layer. The method can also include the steps of forming a dielectric layer on the hemispherical grained silicon layer, and forming a second conductive layer on the dielectric layer.

According to the methods discussed above, a uniform hemispherical grained silicon layer can be formed on a capacitor storage electrode thereby increasing a surface area of the electrode. Accordingly, the capacitance of a resulting capacitor can be increased. A memory device including a capacitor as discussed above can thus provide more reliable operation.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will also be understood that when a layer is referred to as being "on" another layer or substrate, it can be directly on the other layer or substrate, or intervening layers may also be present.

Figure 1:
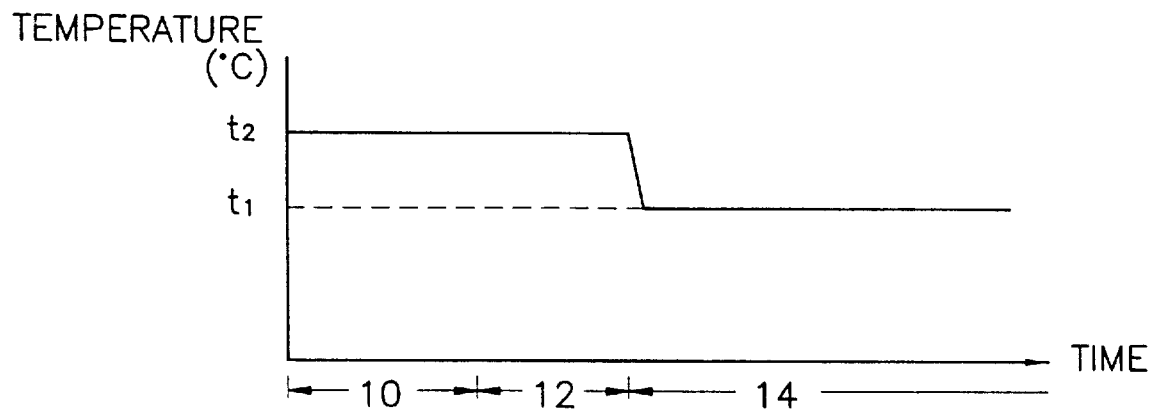
FIG. 1 is a graph illustrating process temperatures for steps of a method of forming a hemispherical grained silicon layer according to the prior art.
Figure 2:
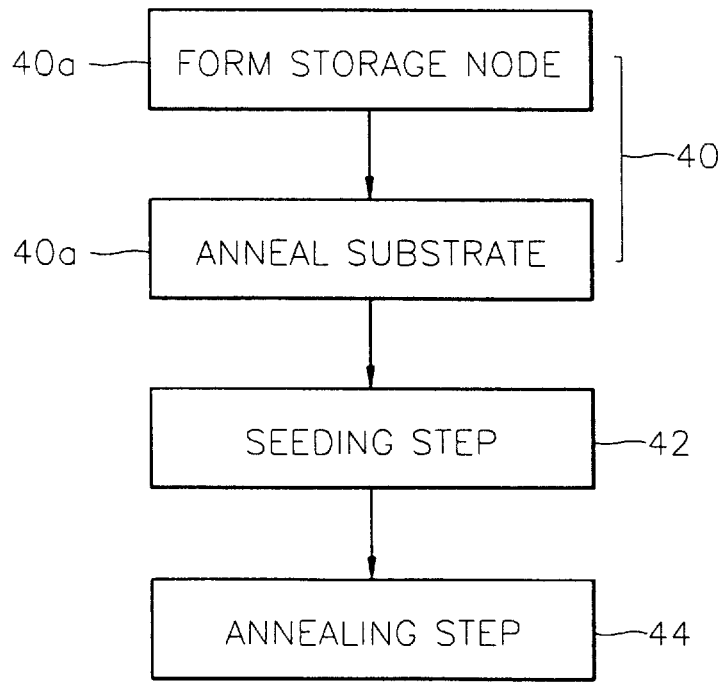
FIG. 2 is a flow chart illustrating steps of a method for forming a hemispherical grained silicon layer according to the present invention.
Figure 3:
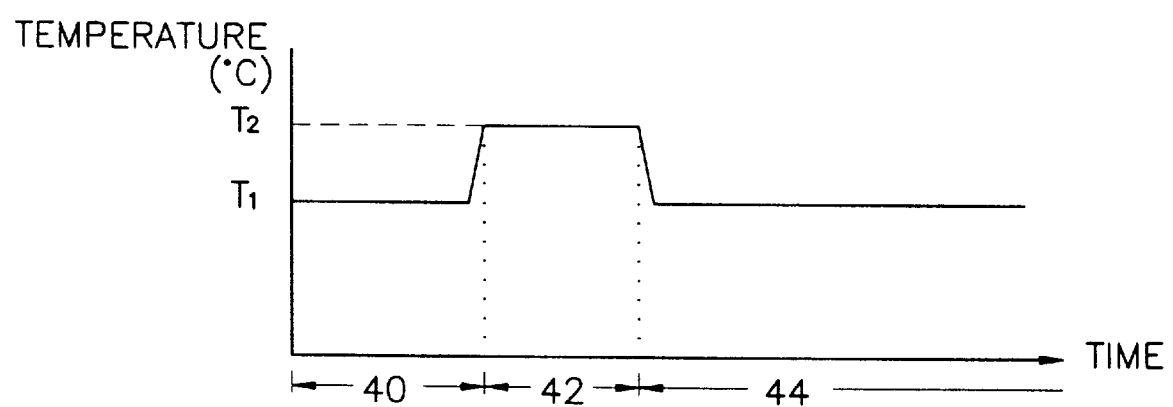
FIG. 3 is a graph illustrating temperatures for steps of a method of forming a hemispherical grained silicon layer according to the present invention.

As shown in FIG. 2, a method of forming a hemispherical grained silicon (HSG-Si) layer for a semiconductor device according to the present invention includes three steps: a standby step 40, a seeding step 42, and an annealing step 44. In greater detail, a standby step 40 includes a step 40a of forming a capacitor storage electrode on a semiconductor substrate, and a step 40b of annealing the substrate including the capacitor storage electrode. As shown in FIG. 3, the standby step 40 is performed at a first temperature $T_1$. Moreover, the standby step, the seeding step, and the annealing step can be performed in a single reaction chamber.

HSG seeds are implanted on the capacitor storage electrode during the seeding step 42. The hemispherical grained silicon layer can be formed by either a selective method or a blanket method. Accordingly, the HSG seeds can either be formed selectively on the capacitor storage electrode, or the HSG seeds can be formed on both the capacitor storage electrode and on exposed portions of the substrate adjacent the storage electrode. For example, if the hemispherical grained silicon layer is selectively formed on the capacitor storage electrode, the HSG seeds are implanted only on the capacitor storage electrode. Alternately, the HSG seeds are implanted on both the capacitor storage electrode and the exposed portions of the substrate when the hemispherical grained silicon layer is formed using a blanket technique. In either case, the hemispherical grained silicon layer is formed on the capacitor storage electrode. It may be preferable, however, to implant the HSG seeds using a selective technique because of the selectivity loss margin of the hemispherical grained silicon layer. Alternately, an etch-back step can be used to remove undesired portions of the hemispherical grained silicon layer on the substrate when using a blanket deposition technique.

The HSG seeds can be implanted by flowing a source gas such as silane ($SiH_4$) or disilane ($Si_2H_6$) over the surface of the substrate including the capacitor storage electrode. As shown in FIG. 3, the seeding step 42 is performed at a second temperature $T_2$. The second temperature $T_2$ is higher than the first temperature $T_1$ as shown.

When the capacitor storage electrode is formed from an amorphous silicon layer, a stable hemispherical grained silicon layer can be formed. Accordingly, it is preferred that the first temperature $T^1$ is lower than a crystallization initialization temperature for the capacitor storage electrode.

The hemispherical grained silicon layer is then formed on the capacitor storage electrode during the annealing step 44. In particular, the structure including the HSG seeds is annealed at a third temperature without flowing the source gas. As a result, silicon (Si) grows around the HSG seeds on the capacitor storage electrode so that a stable hemispherical grained silicon layer is formed on the capacitor storage electrode. During the annealing step 44, the pressure within the reaction chamber is preferably maintained at a pressure on the order of several $\mu$ torrs.

As shown in FIG. 3, the third temperature is preferably the same as the first temperature $T_1$. Alternately, the third temperature may be different from the first temperature. In either case, the third temperature is lower than the second temperature $T_2$. According to one embodiment, the first and second temperatures are no greater than 630° C., while the second temperature is no less than 520° C. According to a second embodiment, the first, second, and third temperatures are in the range of 500° C. to 620° C.

As discussed above, the HSG seeds are implanted at a higher temperature than the steps either before or after the implantation of the HSG seeds thereby increasing the surface area of the capacitor storage electrode. In other words, the seeding step is performed at a higher temperature than the standby and annealing steps. Accordingly, crystallization of the capacitor storage electrode during the standby step is reduced so that a uniform and stable hemispherical grained silicon layer can be formed on the entire surface of the capacitor storage electrode.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a hemispherical grained silicon layer, said method comprising the steps of:

providing a microelectronic substrate having a conductive layer thereon;

maintaining said conductive layer at a first predetermined temperature for a first predetermined period of time;

after said maintaining step, forming hemispherical grained silicon seeds on said conductive layer while maintaining said conductive layer at a second predetermined temperature higher that said first predetermined temperature for a second predetermined period of time; and after forming hemispherical grained silicon seeds, annealing said hemispherical grained silicon seeds at a third predetermined temperature lower than said second predetermined temperature for a third predetermined period of time thereby growing said seeds to form a hemispherical grained silicon layer on said conductive layer.

2. A method according to claim 1 wherein said first and third temperatures are approximately the same.

3. A method according to claim 1 wherein said first and third temperatures are different.

4. A method according to claim 1 wherein said step of forming said hemispherical grained silicon seeds comprises exposing said conductive layer to a silicon source gas chosen from the group consisting of silane ($SiH_4$) and disilane ($Si_2H_6$).

5. A method according to claim 1 wherein said conductive layer comprises amorphous silicon.

6. A method according to claim 1 wherein said step of heating said conductive layer is preceded by the step of patterning said conductive layer so that portions of said substrate are exposed adjacent said patterned conductive layer.

7. A method according to claim 1 further comprising the steps of:
   forming a dielectric layer on said hemispherical grained silicon layer; and
   forming a second conductive layer on said dielectric layer.

8. A method according to claim 1 wherein said first and second predetermined temperatures are no greater than 630° C., and wherein said second predetermined temperature is no less than 520° C.

9. A method according to claim 8 wherein said first predetermined temperature is in the range of 500° C. to 620° C., wherein said second predetermined temperature is in the range of 500° C. to 620° C., and wherein said third predetermined temperature is in the range of 500° C. to 620° C.

10. A method according to claim 1 wherein the step of forming hemispherical grained silicon seeds comprises exposing said conductive layer to a silicon source gas, and wherein the step of annealing said hemispherical grained silicon seeds is performed without the silicon source gas.

11. A method of forming a capacitor, said method comprising the steps of:
   forming a conductive layer on a microelectronic substrate;
   maintaining said conductive layer at a first predetermined temperature for a first predetermined period of time;
   after said maintaining step, forming hemispherical grained silicon seeds on said conductive layer while maintaining said conductive layer at a second predetermined temperature higher than said first predetermined temperature for a second predetermined period of time;
   after forming hemispherical grained silicon seeds, annealing said hemispherical grained silicon seeds at a third predetermined temperature lower than said second predetermined temperature for a third predetermined period of time thereby growing said seeds to form a hemispherical grained silicon layer on said conductive layer;
   forming a dielectric layer on said hemispherical grained silicon layer; and
   forming a second conductive layer on said dielectric layer.

12. A method according to claim 11 wherein said first and third temperatures are approximately the same.

13. A method according to claim 11 wherein said first and third temperatures are different.

14. A method according to claim 11 wherein said step of forming said hemispherical grained silicon seeds comprises exposing said conductive layer to a silicon source gas chosen from the group consisting of silane ($SiH_4$) and disilane ($Si_2H_6$).

15. A method according to claim 11 wherein said conductive layer comprises amorphous silicon.

16. A method according to claim 11 wherein said step of heating said conductive layer is preceded by the step of patterning said conductive layer so that portions of said substrate are exposed adjacent said patterned conductive layer.

17. A method according to claim 11 wherein said first and second predetermined temperatures are no greater than 630° C., and wherein said second predetermined temperature is no less than 520° C.

18. A method according to claim 17 wherein said first predetermined temperature is in the range of 500° C. to 620° C., wherein said second predetermined temperature is in the range of 500° C. to 620° C., and wherein said third predetermined temperature is in the range of 500° C. to 620° C.

19. A method according to claim 11 wherein the step of forming hemispherical grained silicon seeds comprises exposing said conductive layer to a silicon source gas, and wherein the step of annealing said hemispherical grained silicon seeds is performed without the silicon source gas.

* * * * *